United States Patent [19]

Monroe

[11] 4,298,953

[45] Nov. 3, 1981

[54] PROGRAMMABLE ZERO-BIAS FLOATING GATE TAPPING METHOD AND APPARATUS

[75] Inventor: Scott C. Munroe, Acton, Mass.

[73] Assignee: Massachusetts Institute of Technology, Cambridge, Mass.

[21] Appl. No.: 16,334

[22] Filed: Feb. 28, 1979

[51] Int. Cl.[3] .......... G06G 7/19; H03K 5/195

[52] U.S. Cl. .......... 364/825; 364/824; 364/862; 333/165

[58] Field of Search .......... 333/165, 166; 307/221 C, 221 D; 364/819, 821, 823, 824, 825, 862

[56] References Cited

U.S. PATENT DOCUMENTS

| | | | |
|---|---|---|---|
| 3,781,574 | 12/1973 | White et al. | 307/221 D |
| 3,809,923 | 5/1974 | Esser | 333/165 |
| 3,903,406 | 9/1975 | London | 364/821 |
| 3,935,439 | 1/1976 | Buss et al. | 307/221 D |
| 3,952,188 | 4/1976 | Sloate et al. | 364/862 |
| 3,953,745 | 4/1976 | Bailey | 333/165 |
| 4,035,666 | 7/1977 | Collins et al. | 364/862 |
| 4,079,238 | 3/1978 | Lampe | 364/824 |
| 4,100,513 | 7/1978 | Weckler | 364/862 |
| 4,120,035 | 10/1978 | Cases et al. | 364/862 |
| 4,156,924 | 5/1979 | Lampe et al. | 364/862 |

*Primary Examiner*—Felix D. Gruber
*Attorney, Agent, or Firm*—Arthur A. Smith, Jr.; Gary A. Walpert

[57] ABSTRACT

A method and an apparatus for selectively summing the time-varying components of a plurality of electrical voltages are disclosed. The electrical voltages can each be characterized by a quiescent bias component and a time-varying small signal information component. Each electrical voltage is selectively connected to at most one of a plurality of summing buses and each bus is allowed to separately float to a quiescent voltage level corresponding approximately to a selected average value of the bias components of the signals connected thereto. The potential difference measured between the buses corresponds to the difference in the weighted average values of the time-varying components connected to each bus. The weights may be equal or unequal. The method and apparatus provide means for implementing programmable transversal filters and correlation devices.

17 Claims, 6 Drawing Figures

PROGRAMMABLE ZERO-BIAS FLOATING GATE TAPPING METHOD AND APPARATUS

The Government has rights in this invention pursuant to Contract No. AF19(628)-76-C-0002 awarded by the U.S. Department of the Air Force.

BACKGROUND OF THE INVENTION

This invention relates to an apparatus and a method for non-destructively reading and selectively summing the signals at various positions along a shift register and in particular, to an apparatus and a method for reading and selectively summing the electrical signals at the taps of a delay line, for example, fabricated from a charge transfer device which is used in real time transversal filters and correlation devices.

Shift registers and delay lines provide, with varying degrees of timing control, a system for storing analog and/or digital information in a series array. When the shift register or delay line is provided with signal taps, corresponding to sampling the contents of the stored signal at selected times, there becomes available a convenient and efficient method for effecting, at high speed, such operations as correlation, filtering, etc.

Originally, efficient techniques employing delay lines were used substantially only with digital shift registers, in part because of the ease of working with and the low cost of digital circuitry. Recently however, since about 1970, controlled discrete time, continuous amplitude (analog) delay lines, charge transfer devices (CTD's), such as charge coupled devices (CCD's) and bucket brigade devices (BBD's), have become available. These devices store and transfer packets of charge under the control of externally generated clock signals and provide, at a plurality of taps spaced along the delay line, output signals which represent the stored analog signal at specified time intervals. The time intervals depend upon the device structure and the system clocking.

The tapped outputs of the charge transfer device are particularly difficult to read if the information stored therein is not to be altered during the reading procedure. Several methods have been developed, however, for non-destructively reading the tapped outputs of a charge transfer device. According to one method, used with a fixed weight tapping technique which is typical of split-electrode CCD transversal filters, the signal output at each device tap is capacitively coupled to one of two summing buses. One of the buses represents the sum of all positive weights while the second bus represents the sum of all negative weights. A differential current meter then measures the difference in charge flow, or current, which is required to maintain the buses at a fixed preset potential. That charge flow or current is a short duration pulse signal and represents the output of, for example, a transversal filter.

It is often desirable, in connection with transversal filters and correlation devices, to provide a programmable tapping network so that the weights and/or the taps along the delay line can be changed under control of a program control element. One common technique for implementing a programmable correlator comprises connecting a floating gate, which is one preferred structure for accessing the stored information, from each tap position to the gate of a separate buffer MOSFET. The current flowing through each MOSFET, which is modulated by the tapped electrical signal at the respective tapping position, is directed generally through one of two associated program controlled switches, to one of the two summing buses. Thus, each switch connects to the MOSFET output at its input and to one bus at its output. The controlled switches associated with one tapping position are closed at most one at a time and the switching function is generally implemented using additional MOSFET's. The state or states of the additional MOSFET's are controlled by a program control element. The resulting difference in total current flow on the two buses, which are maintained at the same potential, represents the correlator output.

These and other methods for reading and combining the tap outputs of a delay line or shift register each suffer several serious drawbacks. First, there is a large background or bias level which is present, at all times, in the tap output, even during a "no-signal" condition. The bias component or level is a DC offset which is present at each tap for several reasons. First, the signal appearing at each tap originates as a bipolar signal whereas there is the requirement of presenting the output of the tapping system as a unipolar variable such as charge, current, or voltage. Thus, the variable must contain an offset or bias component to allow the relative positive and negative signal excursions to remain unipolar. A second source of the bias offset is a non-zero DC component of the signal in the shift register. In addition, the prior art methods also often require an offset so that the shift register signal electrodes can be preset to a certain level to store or transfer the input signals.

While the individual sources of the offset bias can be of different polarities, the effect of the offset biases add. The result, when the tapped signals are summed on the respective buses, is a total bias level on each bus which is often many times larger than the desired time-varying summed information signal which is being detected. A fundamental problem thereby arises when the number of summed signals on each bus is unequal and can vary, because the bias levels on each bus are then also unequal and can similarly vary. The difference in the bias components of the summed signals on the two buses can be and often is interpreted as part of the time-varying small signal component by the output differencing circuitry.

In the case of a fixed weight tapping method wherein the processed signals have zero or fixed DC levels, the difference in total bias components on the two summing buses is constant. This fact allows the unwanted bias component to be "bucked out" at the output differencing circuitry although there may be practical problems in doing this when the bias difference is much greater than the desired signal as is so often the case. For programmable correlators and filters with adjustable and selectable tap weights, the problem is much more severe. Here the total bias component flowing to each bus is variable and therefore the difference in bias levels when the two buses are "summed" is also variable. This changing difference in bias level is extremely difficult to compensate for and it severely degrades the device dynamic range by placing a lower limitation on the small time-varying signals that can be observed.

Thus for example in programmable correlators used in connection with receivers employing pueudo-random codes, there is a "code-dependent bias" which varies as the numbers of ones and zeros in the reference code vary. This can affect the bias level on each of the respective summing buses and a variable bias can thus occur because bits in the reference code control at least a pair of switches which determine to which summing bus, (if any), the tapped signal (and bias) are directed.

The practical effect of the code-dependent bias on present correlators is to restrict the user to codes which contain a fixed number of ones and zeros. This is a very severe limitation.

In a similar manner, when the tap weights in transversal filters are changed, one is again subject to the impractical limitation of maintaining constant the total bias component on each summing bus.

A principal object of the present invention is therefore an apparatus and method for substantially removing the limitation in programmable correlators and transversal filters, that the numbers of ones and zeros be constant or fixed. Other objects of the invention are an apparatus and method having greater dynamic range than prior art methods and apparatus, having an improved information signal to background signal ratio, and reducing the resulting bias component significantly over prior art systems. Further objects of the invention comprise a non-destructive reading apparatus and method for sensing charge in charge transfer devices, for providing the reading elements on the same semiconductor substrate, and for providing a programmable unit wherein the correlation programming can reliably be varied. Yet further objects of the invention are an apparatus and method which can be used in connection with different varying weightings, which are not limited to a substantially binary reference signal, and which can be used in connection with both transversal filters and correlation methods and devices.

SUMMARY OF THE INVENTION

The invention is directed to a method and apparatus for selectively summing the time-varying signal components of a plurality of electrical potentials for obtaining a selectively weighted average of the time-varying signal components. Each electrical potential can be characterized by the sum of a bias component and the time-varying signal component. The method features the steps of selectively connecting the electrical potentials to at most one of a first and a second summing bus through respective selected impedances; for each bus, allowing the voltage level thereon to float at a quiescent voltage substantially equal to a weighted average of the bias components of the electrical potentials connected thereto; and measuring the potential difference across the buses. Thereby, the measured potential difference characterizes the selectively weighted average of the time-varying components.

In particular embodiments of the method, the electrical potentials correspond to the voltages on the taps of a delay line, preferably a charge transfer device, and the method further features the steps of non-destructively reading tap signals from selected taps of the delay line and weighting each read tap signal by a selected weighting factor, each non-zero weighting factor having substantially the same magnitude to generate the electrical signals. In other embodiments, the method features the steps of changing the selected connection of the electrical potentials to the buses (i.e. programming the connections) while maintaining a substantially constant quiescent operating point on each bus. In another embodiment, the method further features the step of maintaining each bias component substantially equal to each other bias component.

The apparatus according to the invention has means for selectively connecting each electrical potential through a respective impedance to at most one of a first and a second summing bus and means for measuring a potential difference across the buses. Thereby, the measured potential difference characterizes the selectively weighted average of the time-varying components.

The apparatus further features, in a particular embodiment of the invention, a plurality of weighting elements, each weighting element generating, from an electrical input, a corresponding weighted output substantially equal to the sum of a resulting bias component and the multiplicative product of a selected weighting factor and an information component of the corresponding input. The weighted outputs correspond to the electrical potentials noted above.

In other particular embodiments of the invention, the apparatus further comprises a charge transfer device having a plurality of signal taps for providing a plurality of tap signals and means for reading the tap signals and for providing the read tap signals to the remaining circuitry.

In particular, the apparatus is particularly useful in connection with programming the selective connections. In this particular embodiment, the apparatus further features programming control means for selectively varying the connections of the electrical signals to the summing buses. A selectively connecting first means is responsive to the programming control means for connecting each electrical signal to one or the other of the buses, and the apparatus maintains a substantially constant quiescent operating point on each bus as the selective connections are varied by the program control means.

DESCRIPTION OF THE DRAWINGS

Other objects, features, and advantages of the invention will appear from the following description of preferred particular embodiments of the invention taken together with the drawings in which.

PREFERRED PARTICULAR EMBODIMENTS OF THE INVENTION

Figure 1:
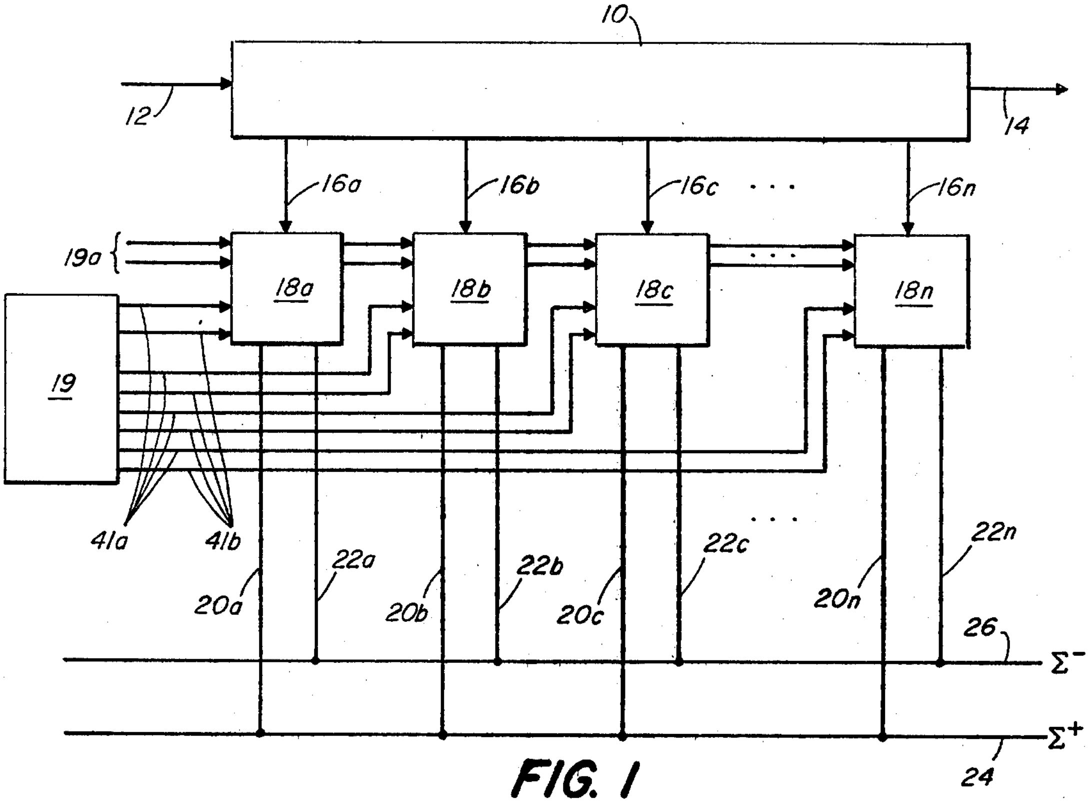
FIG. 1 is a schematic block diagram of an apparatus, according to the invention, for reading and selectively summing the signals from a tapped delay line or shift register.

Referring to FIG. 1, a shift register or delay line 10 receives an electrical input over an input line 12 and provides a delayed electrical signal output over an output line 14. Shift register 10 also provides a plurality of electrical output tap signals over tapped output lines 16*a*, 16*b*, 16*c*, . . . , 16*n*. The shift register 10 may be any type of digital or analog shift register or delay line which is compatible with the readout method and apparatus to be described hereinafter. In particular, the signal levels appearing over tapped output lines 16 in the illustrated embodiment, can be characterized by the sum of a quiescent bias component and a time-varying, small signal AC component. In the illustrated preferred embodiment of the invention, shift register 10 is a charge transfer device (CTD) as are well known in the art.

In general, the output tap signals over lines 16*a*, 16*b*, . . . , 16*n* can carry either digital or analog signal levels, depending upon the particular shift register 10 used. The tap signals may be provided at positions corresponding to periodic or aperiodic time sampling of the electrical signal over line 12.

Lines 16*a*, 16*b*, . . . , 16*n*, connect respectively to weighting and selection elements 18*a*, 18*b*, . . . , 18*n*. Elements 18 are described in greater detail in connection with FIGS. 2 and 3 and provide selected electrical outputs in response to a program control element 19. As described below, power supply biases are provided over lines 19*a*. The selected outputs of elements 18 over lines 20*a*, 20*b*, . . . , 20*n* and 22*a*, 22*b*, . . . , 22*n* connect to summing buses 24 and 26 respectively. Illustrated bus 24 is designated a positive summing bus ($\Sigma+$) and illustrated bus 26 is designated a negative summing bus ($\Sigma-$).

Figure 2:
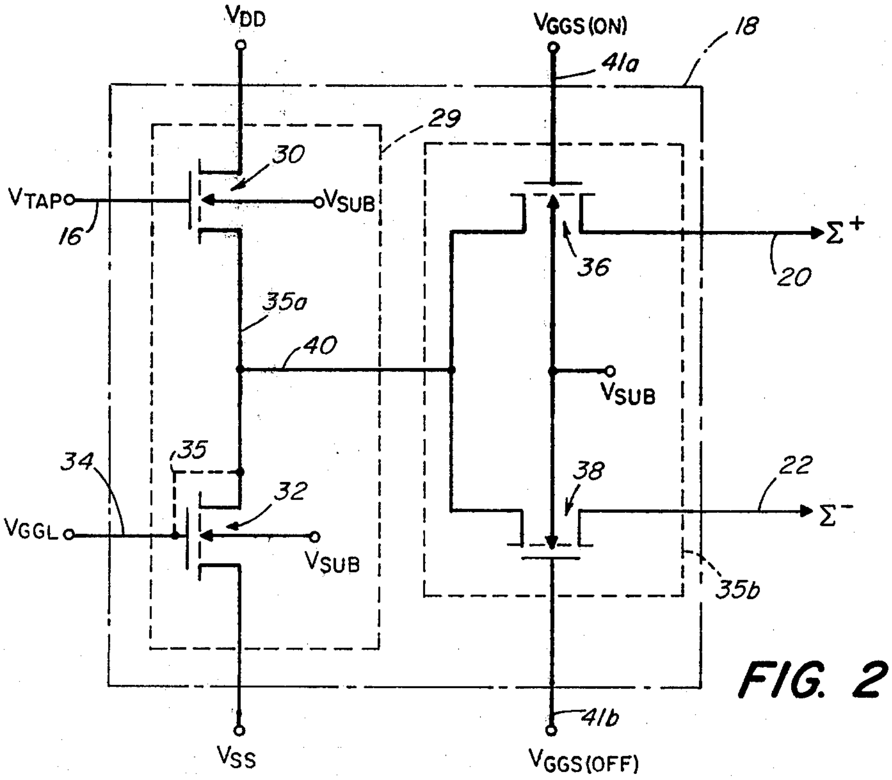
FIG. 2 is an electrical schematic diagram of apparatus responsive to the tapped signals for providing output signals to the summing buses.
Figure 3:
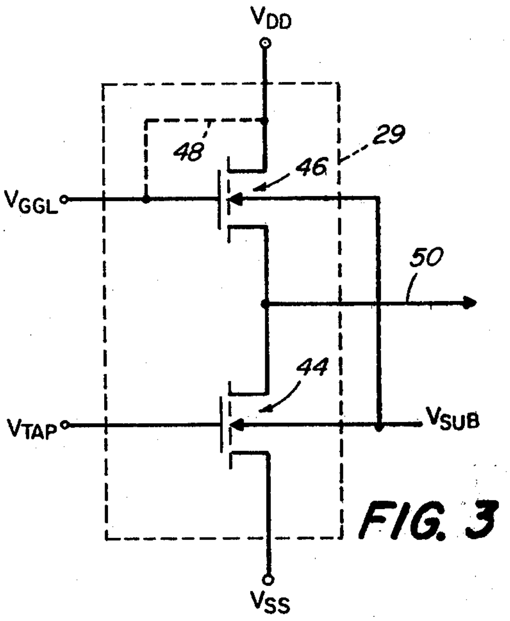
FIG. 3 is an alternate circuit configuration of a portion of the circuit of FIG. 2 for providing output signals to the selection switches.

Referring now to FIG. 2, each element 18, in this first particular embodiment, employs a transistor structure circuit configuration, preferably employing either p- or n- channel MOSFET's of either the enhancement or depletion mode (or suitable combinations of these devices). Other types of field effect transistor (FET's) devices can also be used. The illustrated FIG. 2 structure depicts n- channel enhancement mode MOSFET's having a common substrate potential, $V_{SUB}$, as would occur in an integrated form of the apparatus. A discrete version having different substrate biases, and perhaps using integrated CMOS devices, can be used also.

Still referring to FIG. 2, the first stage 29 of the structure of element 18 has a MOSFET 30, designated the tap MOSFET, in a common drain or source follower configuration. The drain of the tap MOSFET 30 is held at a constant voltage designated $V_{DD}$. The gate input to the MOSFET 30 is the signal from an associated tap of the shift register 10 over one of the lines 16. The tap MOSFET source circuit has an active load comprising a MOSFET 32; and MOSFET 32 has its gate biased at a voltage, designated $V_{GGL}$, over a line 34. For enhancement mode devices, the gate and drain of the active load may be shorted to derive the $V_{GGL}$ (this is indicated by a dotted line 35), but it is advantageously more flexible to provide a separate independent gate bias. The source of the active load MOSFET 32 is tied to a source voltage, designated $V_{SS}$. With this first stage configuration, the unloaded small signal voltage gain, from the tap voltage over lines 16 to the voltage at the common diffusion 35*a* (which in the illustrated embodiment represents the common node of the series connection of MOSFETS 30 and 32) is less than one. Bias voltages $V_{SUB}$, $V_{DD}$, $V_{GGL}$, and $V_{SS}$ correspond to the power supply biases over lines 19*a*.

The second stage 35*b* of element 18 comprises two switching elements 36 and 38 which, in the illustrated embodiment, are also MOSFET's. Other switching elements could also be used. In the illustrated embodiment, each switching element connects between common diffusion 35*a* to at most one of the two summing buses 24 and 26 over lines 20 and 22 respectively. Switch elements 36 and 38 thereby serve two functions. The first function is as a switch to selectively connect the output of the first stage 29 (illustrated here as the common diffusion 35*a*) to one or the other of the summing buses. The second function of elements 36 and 38 is, when in an "ON" state, to behave substantially like a resistive impedance between the common diffusion 35*a* and the selected summing bus.

The switching elements are controlled by the program control element 19 over lines 41*a*, 41*b*. These signals are designated $V_{GGS}$(ON) and $V_{GGS}$(OFF) to indicate that in general, the signals over lines 41*a* and 41*b* are complementary. However, depending upon the particular application of the device, the signals on lines 41*a* and 41*b* can at times, be the same, i.e. both switch elements may be turned off. Also, in normal operation, at most one of the switching elements 36, 38 is turned "ON" at any instant of time and this "closed" switching element determines to which summing bus the electrical signal over line 40 is directed.

As an alternate embodiment to the first stage 29 shown in FIG. 2, a common source arrangement (FIG. 3) can be employed. Here, the active load is in the drain circuit of a tap transistor element, MOSFET 44. As before, the active load gate voltage $V_{GGL}$ can be obtained, for enhancement mode devices, by shorting the gate and drain of the active load element, MOSFET 46, thus trading off convenience for flexibility. This is indicated by the dotted line 48. With this circuit configuration, the magnitude of the unloaded tap to output (the MOSFET 44 drain signal level, available over a line 50) small signal voltage gain can be made greater than one with the proper choice of tap MOSFET 44 and active load MOSFET 46 dimensions. The electrical signal output of the FIG. 3 embodiment is provided over the line 50 to switching elements (not shown) which correspond to the switching elements 36 and 38 shown in FIG. 2 and described hereinbefore.

Figure 4:
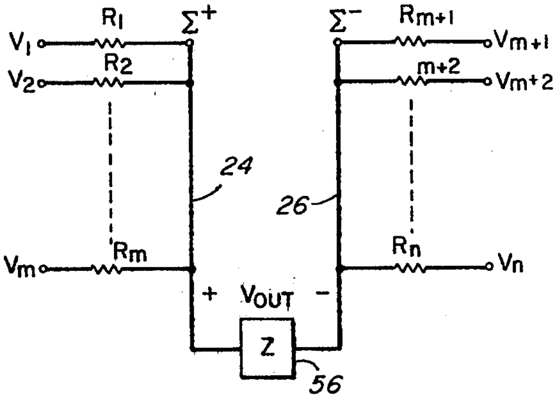
FIG. 4 is an equivalent circuit representation of the interconnection of (a) the signals applied to the summing buses and (b) the summing buses themselves, according to a preferred embodiment of the invention.

Referring now to FIG. 4, the shift register 10 is assumed to have "n" tap positions, "m" of which are directed, under the control of element 19, to the positive summing bus, bus 24, and the remaining (n-m) taps being directed, under control of element 19, to the negative summing bus, bus 26. The connections from each tap position to one summing bus can be characterized by a voltage input $V_K$, which is the unloaded first stage output voltage, through a resistance $R_K$ to the bus. The resistances $R_K$ each equal the resistance of the selected "closed" connecting switch 36 or 38 designated "$R_{ON}$" in series connection with the output resistance of the first stage 29. "$R_{ON}$" is the $R_{DS}$(on) of the respective closed MOSFET switch at each tap. The voltage inputs to the resistors are respectively the voltages $V_k$, where k equals 1, 2, . . . , n, and equal the corresponding tap voltages $v_{TAPk}$ modified by a weighting factor $A_v$ set by the first stage. As noted in the discussion above $A_v$ can, depending upon the configuration and structure of the first stage 29, be greater than or less than one. In the general case, $v_{TAPk}=V_{TAPk}+v_{tapk}$ where $V_{TAPk}$ equals a quiescent or operating point bias component and $v_{tapk}$ is a time-varying, incremental (small-signal AC) variable. The output $V_k$ of the first stage equals $V_o+A_v v_{tapk}$ where $V_o$ is the quiescent or "offset" bias component out of the first stage 29. All of the $V_k$'s can thus be characterized as having a quiescent bias component and a time-varying (AC) small signal component. In the illustrated embodiment, the $V_k$'s are the electrical signals over lines 40 or 50.

Ideally, all of the bias components $V_o$ are equal for each tap of the delay line or shift register. In the illustrated embodiment, and in the description and analysis which follows, they are assumed to be equal and in most practical circumstances will be substantially equal. Referring to FIG. 4, the buses are allowed to "float", and each bus assumes a voltage which is substantially equal to the average of the bias components of the inputs, $V_k$, modified by the instantaneous values of the time-varying voltage components, $v_{tapk}$ connected to the respective bus. Under these circumstances, and in the most general case wherein an impedance 56 having a resistance of value $R_L$ (which can, for all practical purposes, be infinite), is connected between the buses, the resulting potential difference $v_{out}$ between the buses is:

$$v_{out} = \frac{A_v R_L}{R_L + R^+ + R^-}\left[R^+ \sum_{i=1}^{m} \frac{v_{tapi}}{R_i} - R^- \sum_{j=m+1}^{n} \frac{v_{tapj}}{R_j}\right] \quad (1)$$

where R+ is the equivalent parallel resistance of all resistors $R_i$ connected to the positive summing bus 24 and R− is the equivalent parallel resistance of all resistors $R_j$ connected to the negative summing bus 26.

It has been assumed that not only are all of the $V_o$ (the bias components) equal, but in addition that the first stage gains $A_{vk}$ are also equal. This need not be so and therefore, if desired, equation (1) above can be generalized so that the gains of the first stages $A_{vk}$ are variable. However, the variability of $A_{vk}$ must be accomplished without disturbing the bias component output $V_o$ of the first stage 29.

Two useful approximations can be derived from Equation 1.

If $R_L << R^+ + R^-$, then:

$$v_{out} \cong \frac{A_v R_L}{R^+ + R^-}\left[R^+ \sum_{i=1}^{m} \frac{v_{tapi}}{R_i} - R^- \sum_{j=m+1}^{n} \frac{v_{tapj}}{R_j}\right] \quad (1a)$$

If $R_L >> R^+ + R^-$ then:

$$v_{out} \cong A_v\left[R^+ \sum_{i=1}^{m} \frac{v_{tapi}}{R_i} - R^- \sum_{j=m+1}^{n} \frac{v_{tapj}}{R_j}\right] \quad (1b)$$

When the $R_k$ are all equal (to R), Equation (1a) reduces to:

For $R_L <<$ $$\frac{4R}{n}:$$

$$v_{out} \cong \frac{A_v R_L}{n R}\left[(n-m) \sum_{i=1}^{m} v_{tapi} - m \sum_{j=m+1}^{n} v_{tapj}\right] \quad (2a)$$

and Equation (1b) reduces to:

For $R_L >>$ $$\frac{nR}{m(n-m)},$$

$$v_{out} \cong A_v\left[\frac{1}{m} \sum_{i=1}^{m} v_{tapi} - \frac{1}{(n-m)} \sum_{j=m+1}^{n} v_{tapj}\right] \quad (2b)$$

and when m=n/2, (n even) and $R_L <<$ $$\frac{4R}{n}$$

$$v_{out} = \frac{A_v R_L}{2R}\left[\sum_{i=1}^{n/2} v_{tapi} - \sum_{j=n/2+1}^{n} v_{tapj}\right] \quad (3a)$$

and when m=n/2, (n even) and $R_L >>$ $$\frac{4R}{n}$$

$$v_{out} = \frac{2A_v}{n}\left[\sum_{i=1}^{n/2} v_{tapi} - \sum_{j=n/2+1}^{n} v_{tapj}\right] \quad (3b)$$

Either Equation 3a or 3b takes the form of a typical correlation output useful, for example, in connection with the real time recognition of a pseudo-random code string in a received analog signal. Importantly, programming control element 19 controls the connections to the bus and provides the capability of changing the connections.

Similarly, transversal filters may be implemented using the inventive method and structure because the elimination of the individual bias components in the final result is not dependent upon a match between all of the resistances $R_i$.

Thus, unlike other reading methods and apparatus, there is no code-dependent or weight-dependent component of the potential difference output $v_{out}$. $v_{out}$ is composed entirely of the small signal time-varying components of the input signals, and the need to detect a small signal riding on a large DC bias (background) level is eliminated.

The inventive method and apparatus is also amendable to multi-state weighting methods and two-quadrant multiplication. For example, a ternary weighting method can be performed by turning both switches off to realize a null or zero weight.

Figure 5A:
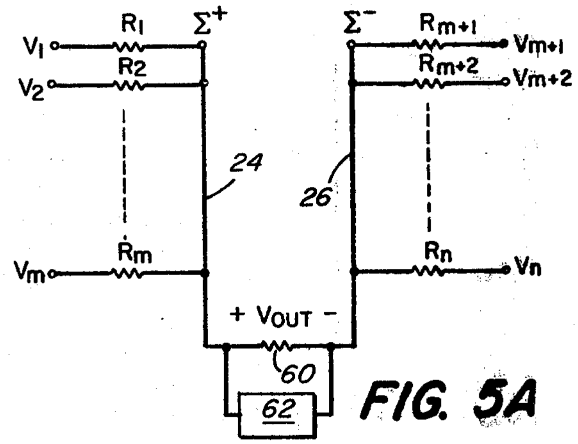
FIGS. 5A and 5B are particular electrical circuit configurations for measuring the potential difference between the summing buses.
Figure 5B:
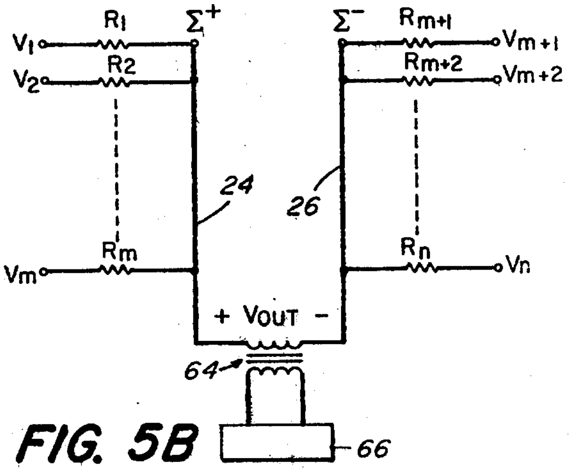

Referring now to FIGS. 5A and 5B, several different circuit configurations can be employed to measure the potential difference between the positive and negative summing buses. Referring in particular to FIG. 5A, in a preferred embodiment of the invention, a series resistance 60, which includes the input impedance of the measuring device and which may be substantially infinite, is placed between the summing buses and a differential amplifier 62 is employed to buffer and amplify the voltage across the two buses. Thus the voltage output of differential amplifier 62 represents the potential difference between the buses.

Referring now to FIG. 5B, a transformer 64 couples the potential difference generated between the summing buses, and a voltage measurement circuit 66 is connected directly across the transformer secondary. In this way, the output voltage can be measured and amplified, if desired.

The invention has been described in connection with charge transfer devices, however it is equally applicable to any delay line device in which the tapped outputs, after weighting, can be characterized in terms of a bias component and a time-varying or AC small signal component. The full power and advantage of the invention is also realized when the weightings are subject to a programming control element because, according to the invention, the bias components do not add and the output signal-to-background signal ratio of the system is effectively and substantially increased.

Similarly, elements 18 have been described as an integrated structure of MOSFET devices. As will be well known to one skilled in the art, other devices can be satisfactorily used for the components of element 18.

Thus, additions, subtractions, deletions, and other modifications of the disclosed particular embodiments of the invention will be obvious to those skilled in the art, and are within the scope of the following claims.

What is claimed is:

1. A method for selectively summing the time-varying components of a plurality of electrical potentials for obtaining a selectively weighted average of said time-varying signal components, each electrical potential able to be characterized by the sum of a bias component and a said time-varying signal component, said method comprising the steps of selectively connecting using electrical control signals said electrical potentials to at most one of a first and a second summing bus through respective selected impedances, for each bus, allowing the voltage level thereon to float at a voltage substantially equal to a weighted average of the bias components of the electrical potentials connected thereto, and measuring the potential difference across said buses, whereby said potential difference characterizes the selectively weighted average of said time-varying components.

2. The method of claim 1 wherein said electrical potentials correspond to voltages on taps of a delay line and further comprising the steps of non-destructively reading tap signals from selected taps of said delay line, and weighting each read tap signal by a selected weighting factor, each non-zero weighting factor having substantially the same magnitude, to generate said electrical signals.

3. The method of claim 1 further comprising the step of programming the selected connections of the electrical potentials to said buses, while maintaining a substantially constant quiescent operating point on each bus.

4. The method of claim 1 further comprising the step of maintaining each said bias component substantially equal to said other bias components.

5. A method of selectively summing the time-varying signal components of a plurality of electrical potentials for obtaining a selectively weighted average of said time-varying signal components, each electrical potential being adapted to be characterized by the sum of a bias component and a said time-varying signal component, the method comprising the steps of non-destructively reading tap signals from selected taps of a delay line, weighting each read tapped signal by a selected weighting factor, each non-zero weighting factor having substantially the same magnitude, selectively connecting, according to a program control element, the weighted electrical signals to at most one of a first and a second summing bus through respective selected impedances, for each bus, allowing the voltage on said bus to float at a voltage substantially equal to the average value of the bias components of the electrical signals connected to said bus, connecting said buses through a load impedance for measuring the potential difference across said connected buses, whereby said voltage difference characterizes the selectively weighted average of said time-varying components.

6. The method of claim 5 further comprising the step of maintaining each said bias component substantially equal to said other bias components.

7. The method of claim 6 further comprising the steps of changing the selected connections of the electrical signals to said buses, while maintaining a substantially constant information signal-to-background signal ratio at said measured potential difference signals.

8. An apparatus for selectively summing the time-varying signal components of each of a plurality of electrical potentials for obtaining a selectively weighted average of said time-varying signal components, each potential being characterized by the sum of a bias component and a said time-varying signal component, said apparatus comprising first means for selectively connecting each said electrical potential through a respective impedance to at most one of a first and a second summing bus, the voltage level on each bus being allowed to float at a voltage substantially equal to a weighted average of the bias components of the electrical potentials connected thereto, and second means for measuring a potential difference across said buses, whereby said measured potential difference characterizes the selectively weighted average of said time-varying signal components.

9. The apparatus of claim 8 further comprising a plurality of weighting means, each weighting means for generating from an electrical input, a corresponding weighted output substantially equal to the sum of a resulting bias component and the multiplicative product of a selected weighting factor and an information component of said corresponding input, wherein at least one of said weighting factors is a non-zero weighting factor and said weighted outputs correspond to said electrical potentials.

10. The apparatus of claim 9 further comprising a delay line having a plurality of taps for providing a plurality of tap output signals, each said tap output signal corresponding to a said electrical input, and wherein each said weighting means comprises a series connection of at least first and second FET devices, said first device having one said tap signal connected to a gate terminal and a gate bias connected to a gate terminal of said second device, and wherein the signal appearing at said series connection is a said electrical potential.

11. The apparatus of claim 10 wherein said non-zero weighting factors each have the same magnitude and each said first connecting means comprises third and fourth FET devices, each of said third and fourth devices being connected to a corresponding weighting means at said series connection for connecting said electrical potential to at most one of said summing buses.

12. The apparatus of claim 8 further comprising a charge transfer device having a plurality of signal taps for providing a plurality of tap signals, and means for non-destructively reading said tap signals and for providing said read tap signal to said first connecting means, said electrical potentials corresponding to the signals appearing at said taps.

13. The apparatus of claim 8 wherein said second means for measuring said potential difference across said buses comprises a series resistance connected between said bus lines whereby said potential difference is generated across said resistance.

14. The apparatus of claim 8 wherein said second means for measuring the potential difference across said buses comprises a transformer having at least a primary and a secondary winding, one of said windings being connected between said first and second summing buses, and means connected across said other winding for measuring a potential difference across it.

15. The apparatus of claim 8 further comprising programming control means for selectively varying the connections of said electrical potentials to said summing buses, said selectively connecting first means being responsive to said programming control means for connecting each said electrical potential to one or the other of said buses, and said apparatus maintaining a substantially constant quiescent operating point on each bus as said connections are varied by said program control means.

16. The apparatus of claim 8 further comprising an impedance connected across said summing buses.

17. An apparatus for selectively summing the time-varying signal components of each of a plurality of electrical potentials for obtaining a selectively weighted average of said time-varying signal components, each potential being characterized by the sum of a bias component and a said time-varying signal component, said apparatus comprising a delay line having a plurality of taps for providing a plurality of tap output signals, a plurality of weighting means, each weighting means for generating from each said tap output signal a corresponding electrical output, each output being substantially equal to the sum of a resulting bias component and the multiplicative product of a selected weighting factor and a time varying component of the corresponding input, at least one of said weighting factors being a non-zero weighting factor and said non-zero weighting factors each having the same magnitude, said output corresponding to said electrical potentials, a programming control means, first means responsive to said programming control means for selectively connecting each said electrical output to at most one of a first and a second summing bus, and second means for measuring a potential difference between said buses, the quiescent operating point on each bus corresponding substantially to an average value of the bias components of the signals connected to said bus, whereby said potential difference between said buses characterizes the selectively weighted summation of said time-varying signal components.

* * * * *

UNITED STATES PATENT AND TRADEMARK OFFICE
CERTIFICATE OF CORRECTION

PATENT NO. : 4,298,953

DATED : November 3, 1981

INVENTOR(S) : Scott C. Munroe

It is certified that error appears in the above-identified patent and that said Letters Patent is hereby corrected as shown below:

On the title page, at the top, the inventor's name "Monroe" should read -- Munroe --

Signed and Sealed this

*Seventh* Day of *December 1982*

[SEAL]

*Attest:*

GERALD J. MOSSINGHOFF

*Attesting Officer* *Commissioner of Patents and Trademarks*